United States Patent
Chen et al.

(10) Patent No.: US 9,960,142 B2
(45) Date of Patent: *May 1, 2018

(54) HYBRID BONDING WITH AIR-GAP STRUCTURE

(71) Applicant: Taiwan Semiconductor Manufacturing Company, Ltd., Hsin-Chu (TW)

(72) Inventors: Szu-Ying Chen, Toufen Township (TW); Dun-Nian Yaung, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days. days.

This patent is subject to a terminal disclaimer.

(21) Appl. No.: 15/071,576

(22) Filed: Mar. 16, 2016

(65) Prior Publication Data

US 2016/0197049 A1 Jul. 7, 2016

Related U.S. Application Data

(63) Continuation of application No. 14/302,666, filed on Jun. 12, 2014, now Pat. No. 9,312,229.

(51) Int. Cl.
*H01L 21/3063* (2006.01)
*H01L 23/00* (2006.01)
(Continued)

(52) U.S. Cl.
CPC .......... *H01L 24/80* (2013.01); *H01L 21/3081* (2013.01); *H01L 21/764* (2013.01); *H01L 23/498* (2013.01); *H01L 23/5226* (2013.01); *H01L 23/53228* (2013.01); *H01L 23/53295* (2013.01); *H01L 24/03* (2013.01); *H01L 24/05* (2013.01); *H01L 24/06* (2013.01); *H01L 24/08* (2013.01); *H01L 24/09* (2013.01); *H01L 24/83* (2013.01); *H01L 24/93* (2013.01); *H01L 25/0657* (2013.01); *H01L 25/50* (2013.01); *H01L 23/5329* (2013.01);
(Continued)

(58) Field of Classification Search
CPC .......... H01L 24/05; H01L 24/08; H01L 24/80
USPC .......... 257/737, 739, 773–775, 686; 438/106, 438/107, 109
See application file for complete search history.

(56) References Cited

U.S. PATENT DOCUMENTS 5,911,887 A * 6/1999 Smith ............... H01L 21/31116
216/67
6,307,755 B1 10/2001 Williams et al.
(Continued)

OTHER PUBLICATIONS

Tan, C.S., et al., "Observation of interfacial void formation in bonded copper layers," AIP Applied Physics Letters, 87, 201909, Jun. 20, 2005, 4 pages. (Provided in parent application).

*Primary Examiner* — Victoria K Hall
(74) *Attorney, Agent, or Firm* — Slater Matsil, LLP (57) ABSTRACT

A package component includes a surface dielectric layer having a first planar surface, and a metal pad in the surface dielectric layer. The metal pad includes a diffusion barrier layer that includes sidewall portions, and a metallic material encircled by the sidewall portions of the diffusion barrier layer. The metallic material has a second planar surface level with the first planar surface. An air gap extends from the second planar surface of the metallic material into the metallic material. An edge of the air gap is aligned to an edge of the metallic material.

20 Claims, 10 Drawing Sheets

(51) Int. Cl.
*H01L 23/498* (2006.01)
*H01L 23/522* (2006.01)
*H01L 21/308* (2006.01)
*H01L 21/764* (2006.01)
*H01L 25/00* (2006.01)
*H01L 25/065* (2006.01)
*H01L 23/532* (2006.01)

(52) U.S. Cl.
CPC ............ *H01L 23/53204* (2013.01); *H01L 2224/03845* (2013.01); *H01L 2224/05554* (2013.01); *H01L 2224/05571* (2013.01); *H01L 2224/05647* (2013.01); *H01L 2224/0601* (2013.01); *H01L 2224/08147* (2013.01); *H01L 2224/0901* (2013.01); *H01L 2224/80895* (2013.01); *H01L 2224/80896* (2013.01); *H01L 2225/06524* (2013.01); *H01L 2924/00011* (2013.01); *H01L 2924/01322* (2013.01); *H01L 2924/351* (2013.01)

(56) References Cited

U.S. PATENT DOCUMENTS

| | | | |
|---|---|---|---|
| 8,053,277 B2 | 11/2011 | Yu et al. | |
| 8,525,354 B2 | 9/2013 | Wu et al. | |
| 8,802,538 B1 | 8/2014 | Liu et al. | |
| 9,312,229 B2* | 4/2016 | Chen | H01L 23/498 |
| 2002/0163072 A1 | 11/2002 | Gupta et al. | |
| 2002/0175419 A1* | 11/2002 | Wang | C25D 5/02 |
| | | | 257/774 |
| 2003/0193076 A1 | 10/2003 | Patti | |
| 2004/0248401 A1* | 12/2004 | Satake | C09G 1/02 |
| | | | 438/634 |
| 2005/0161795 A1 | 7/2005 | Tong et al. | |
| 2006/0151887 A1* | 7/2006 | Oh | H01L 21/76808 |
| | | | 257/774 |
| 2006/0211242 A1* | 9/2006 | Hsu | H01L 21/31053 |
| | | | 438/675 |
| 2008/0006938 A1 | 1/2008 | Patti et al. | |
| 2009/0124172 A1* | 5/2009 | Uchikura | C09G 1/02 |
| | | | 451/36 |
| 2009/0176372 A1* | 7/2009 | Minamihaba | C09G 1/02 |
| | | | 438/693 |
| 2009/0325384 A1* | 12/2009 | Yamada | H01L 21/76819 |
| | | | 438/692 |
| 2010/0258890 A1 | 10/2010 | Ahn | |
| 2011/0084403 A1 | 4/2011 | Yang et al. | |
| 2012/0094469 A1 | 4/2012 | Landru | |
| 2013/0009321 A1 | 1/2013 | Kagawa et al. | |
| 2013/0020704 A1 | 1/2013 | Sadaka | |
| 2013/0207268 A1 | 8/2013 | Chapelon | |
| 2013/0320556 A1 | 12/2013 | Liu et al. | |
| 2014/0015088 A1 | 1/2014 | Chapelon | |
| 2014/0117546 A1 | 5/2014 | Liu et al. | |
| 2014/0175614 A1 | 6/2014 | Wang et al. | |
| 2014/0175655 A1* | 6/2014 | Chen | H01L 23/481 |
| | | | 257/762 |
| 2014/0264948 A1 | 9/2014 | Chou et al. | |
| 2014/0339698 A1 | 11/2014 | Cassidy et al. | |
| 2016/0049371 A1* | 2/2016 | Lee | H01L 21/76898 |
| | | | 257/621 |

* cited by examiner

HYBRID BONDING WITH AIR-GAP STRUCTURE

PRIORITY CLAIM AND CROSS-REFERENCE

This application is a continuation of U.S. patent application Ser. No. 14/302,666, entitled, "Hybrid Boding with Air-Gap Structure," filed Jun. 12, 2014, which application relates to the following commonly-assigned U.S. patents: application Ser. No. 13/895,122, filed May 15, 2013, and entitled "Air Trench in Packages Incorporating Hybrid Bonding;" which application is hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence melted. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

The previously developed bonding methods have their advantageous features and disadvantageous features. For example, the fusion bonding requires low forces, and may be performed at room temperature. However, since there is no electrical connection between the bonded wafers, extra electrical connections need to be made to interconnect the bonded wafers. Eutectic bonding does not require high-quality surfaces, and hence the pre-requirement for a successful bonding is loosened. The accuracy of eutectic bonding, however, is low, and there may be metal-squeeze problem during eutectic bonding due to the melting of the bonding metals. The direct metal-to-metal bonding has a high accuracy. The throughput, however, is very low. In the hybrid bonding, on the other hand, the metal pads have higher Coefficients of Thermal Expansion (CTEs) than the dielectric layers at the surfaces of the bonded wafers. This results in problems for the bonding of the surface dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for forming package components and bonding the package components through hybrid bonding is provided in accordance with various exemplary embodiments. The intermediate stages of the formation process and the bonding process are illustrated. The variations of the formation process in accordance with the embodiments are discussed. Throughout the various views and illustrative embodiments, like reference numbers are used to designate like elements.

Figure 1:
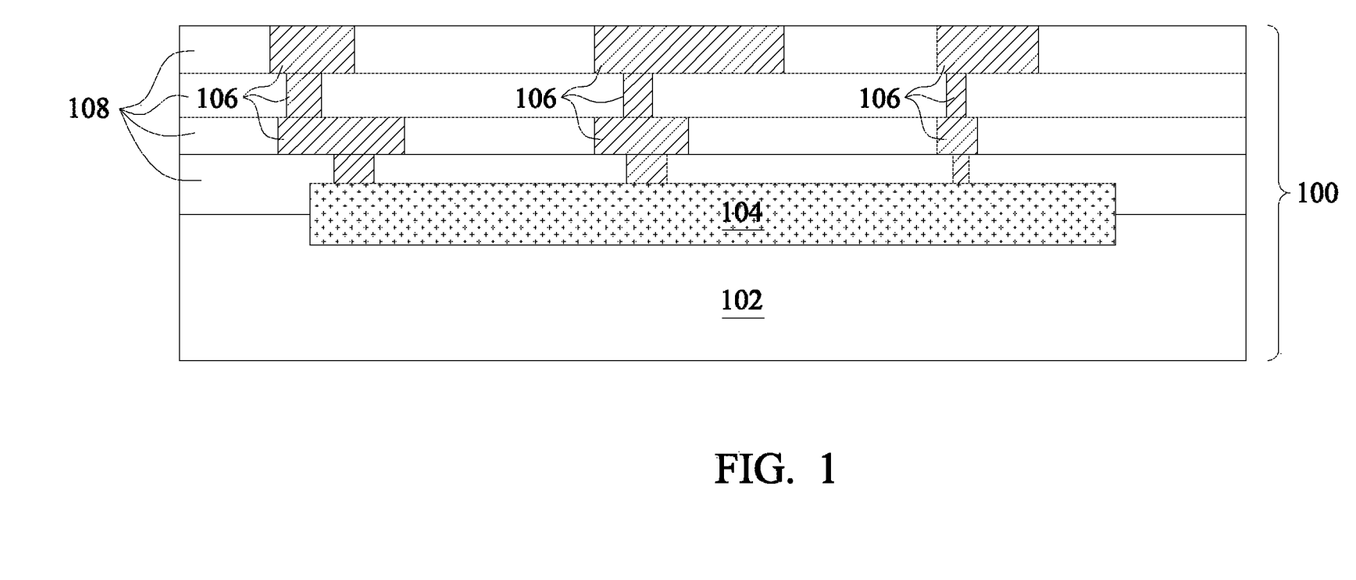
FIGS. 1 through 6 are cross-sectional views of intermediate stages in the formation of a first package component in accordance with some exemplary embodiments.

FIGS. 1 through 6 illustrate cross-sectional views of intermediate stages in a formation of a package component in accordance with some embodiments of the present disclosure. Referring to FIG. 1, an initial structure of package component 100 is illustrated. Package component 100 may comprise a device wafer, a packaged wafer, an interposer wafer, or the like. In the embodiments in which package component 100 comprises a device wafer, package component 100 may include semiconductor substrate 102, which may be, for example, a silicon substrate, while other semiconductor substrates such as silicon carbon substrates, silicon germanium substrates, III-V compound semiconductor substrates are also usable.

Figure 6:
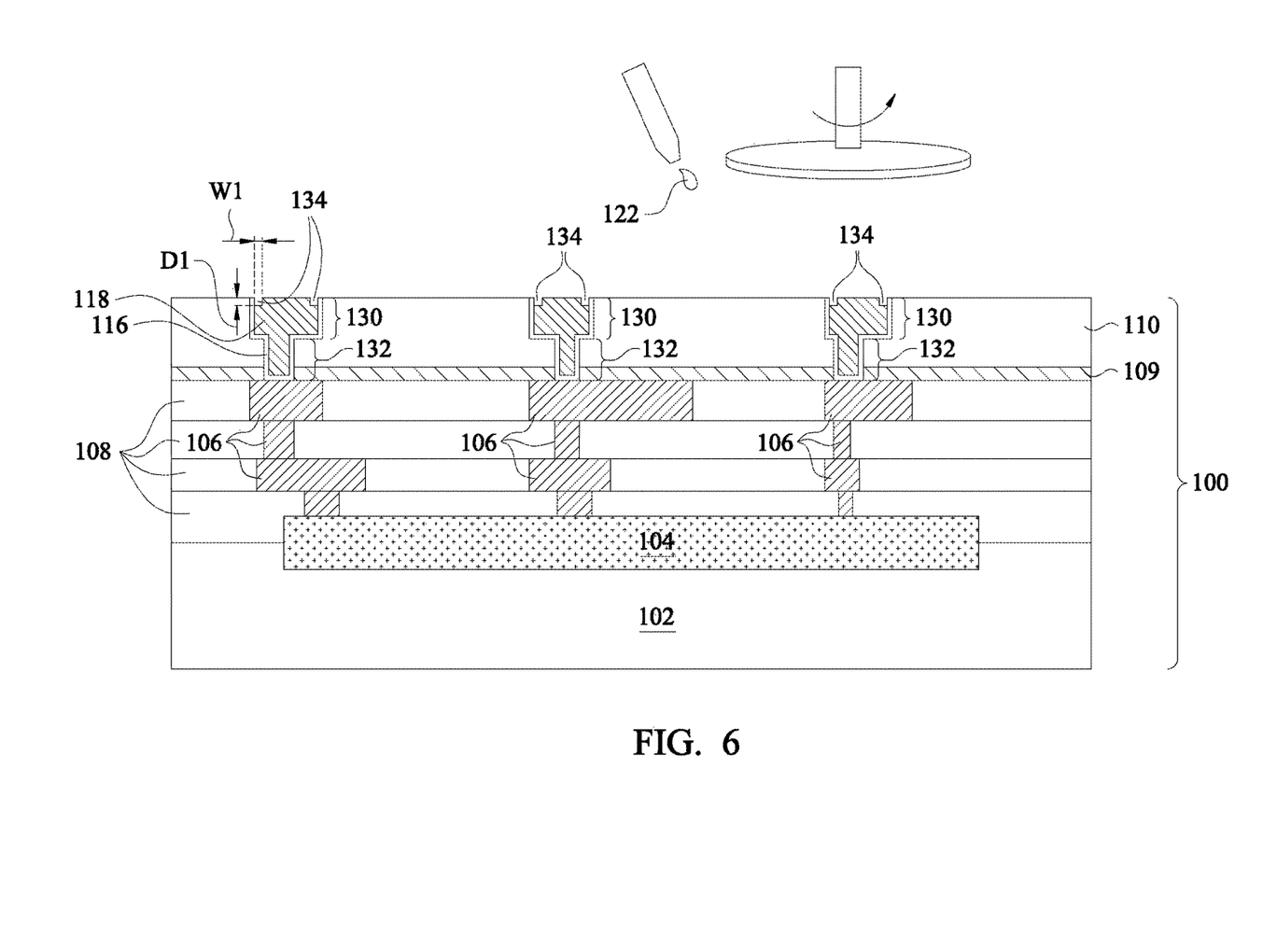

Active devices 104 may be formed at a surface of substrate 102, and may include, for example, transistors. Metal lines and vias 106 are formed in dielectric layers 108, which may include Inter-Layer Dielectric (ILD), Inter-Metal Dielectric (IMD) layers, passivation layers, and the like. The ILD layer and the IMD layers may be low-k dielectric layers in some embodiments, which have dielectric constants (k values) lower than about 3.5, lower than about 3.0, or lower than about 2.5. Dielectric layers 108 may also comprise non-low-k dielectric materials having dielectric constants (k values) greater than 3.9. Metal lines and vias 106 may comprise copper, aluminum, nickel, tungsten, or alloys thereof. Metal lines and vias 106 interconnect active devices 104, and may electrically connect active devices 104 to the overlying metal pads 130 (FIG. 6).

In alternative embodiments, package component 100 is an interposer wafer, which is free from active devices therein. Package component 100 may, or may not, include passive devices (not shown) such as resistors, capacitors, inductors, transformers, and the like in accordance with some embodiments.

In yet alternative embodiments, package component 100 is a package substrate. In some embodiments, package component 100 is a laminate package substrate, wherein conductive traces 106 (which are schematically illustrated) are embedded in laminate dielectric layers 108. In alternative embodiments, package component 100 comprises built-up package substrates, which further comprise cores (not shown), and conductive traces (represented by 106) built on opposite sides of the cores. The conductive traces 106 are interconnected through conductive features in the cores.

Figure 2:
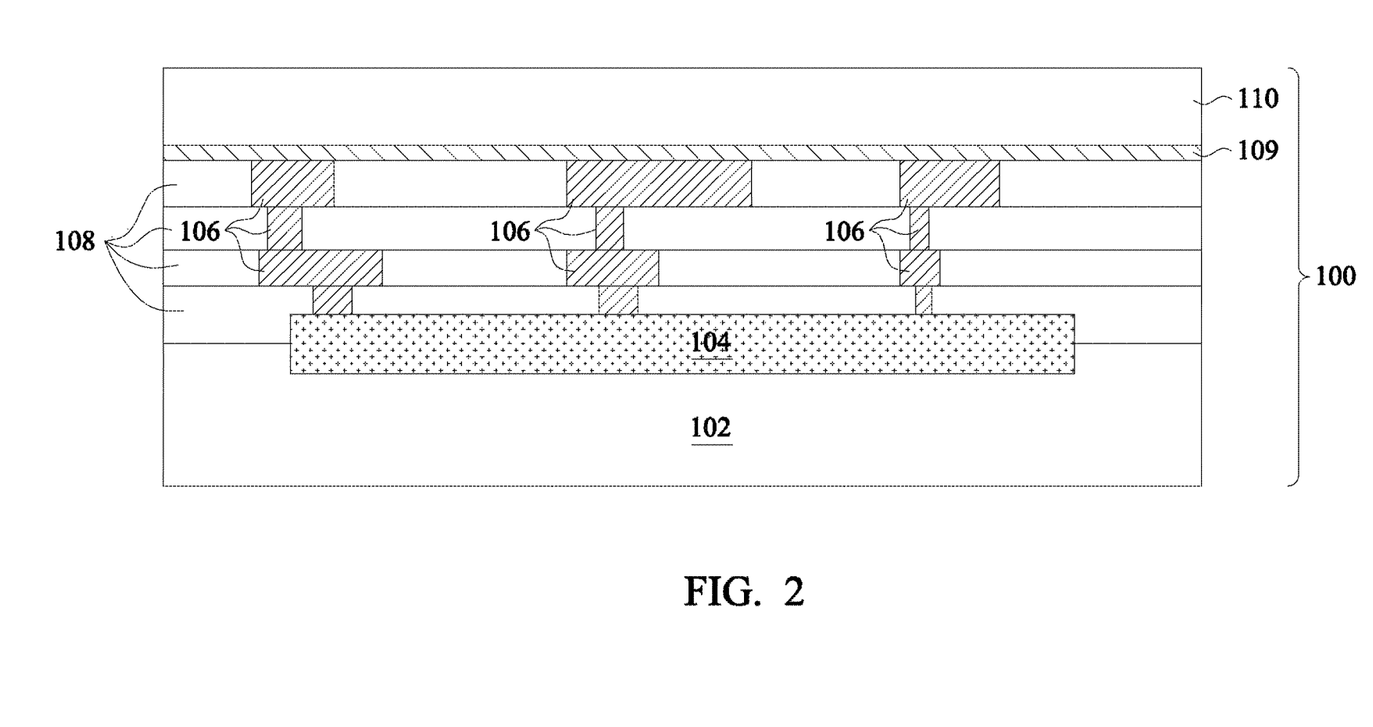

Referring to FIG. 2, etch stop layer 109 is formed at the surface of package component 100. Etch stop layer 109 comprises a dielectric material, which may include silicon carbide, silicon oxide, silicon nitride, or the like. Next, surface dielectric layer 110 is formed over etch stop layer 109. In some embodiments, surface dielectric layer 110 is an oxynitride layer, which may comprise silicon oxynitride (SiON). In alternative embodiments, surface dielectric layer 110 comprises other materials such as silicon oxide ($SiO_2$), silicon nitride (SiN), or the like.

Figure 3:
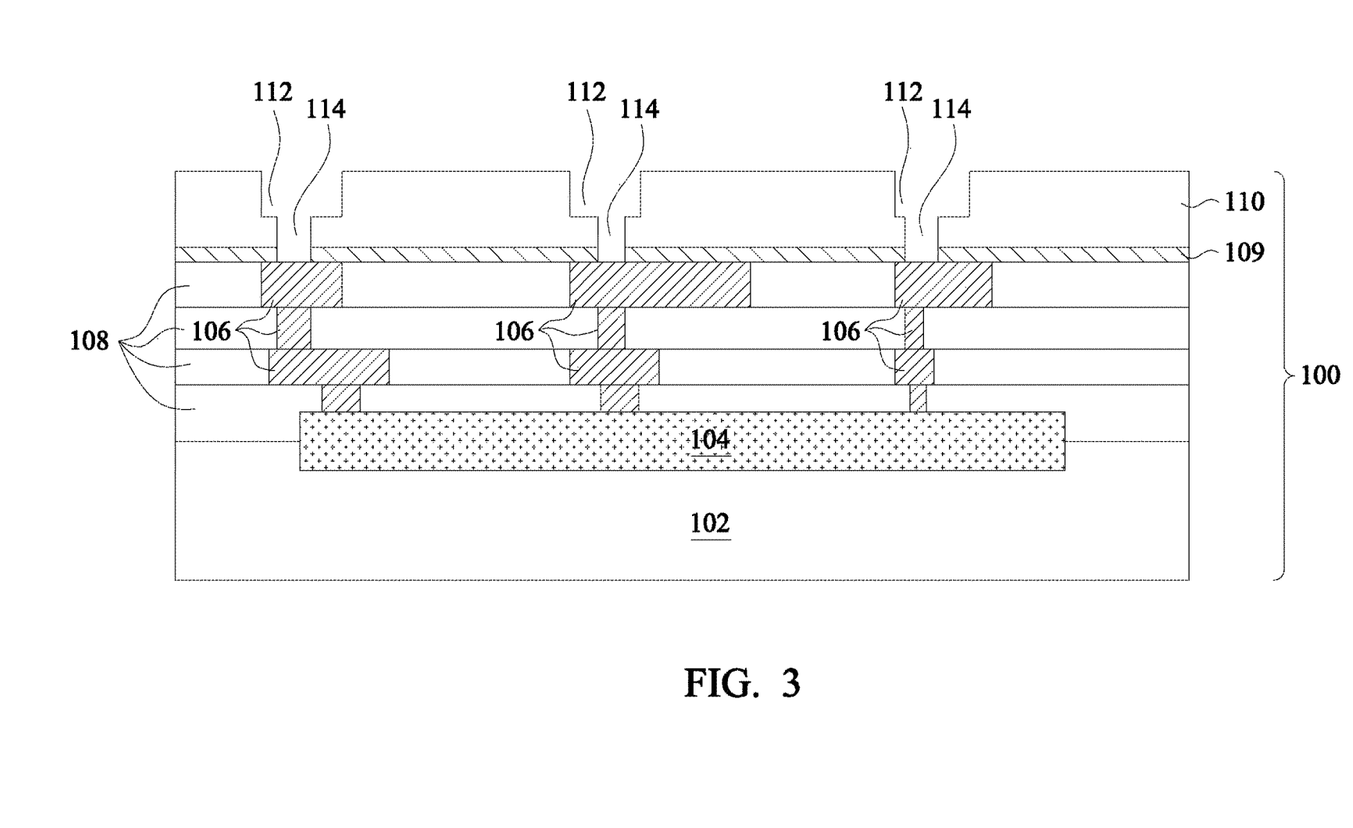

Referring to FIG. 3, trenches 112 and via openings 114 are formed in surface dielectric layer 110. Photo resists (not shown) and/or hard masks (not shown) are formed and patterned over surface dielectric layer 110 to aid the formation of via openings 114 and trenches 112. In some embodiments, an anisotropic etch is performed to form via openings 114. The bottom of via openings 114 may be at an intermediate level of surface dielectric layer 110, wherein the intermediate level is between the top surface and the bottom surface of surface dielectric layer 110. Trenches 112 are then formed through an etching step, during the process for forming trenches 112, via openings 114 extend down to reach the underlying etch stop layer 109. Next, etch stop layer 109 is etched through, so that metal pads/lines 106 are exposed.

Figure 4:
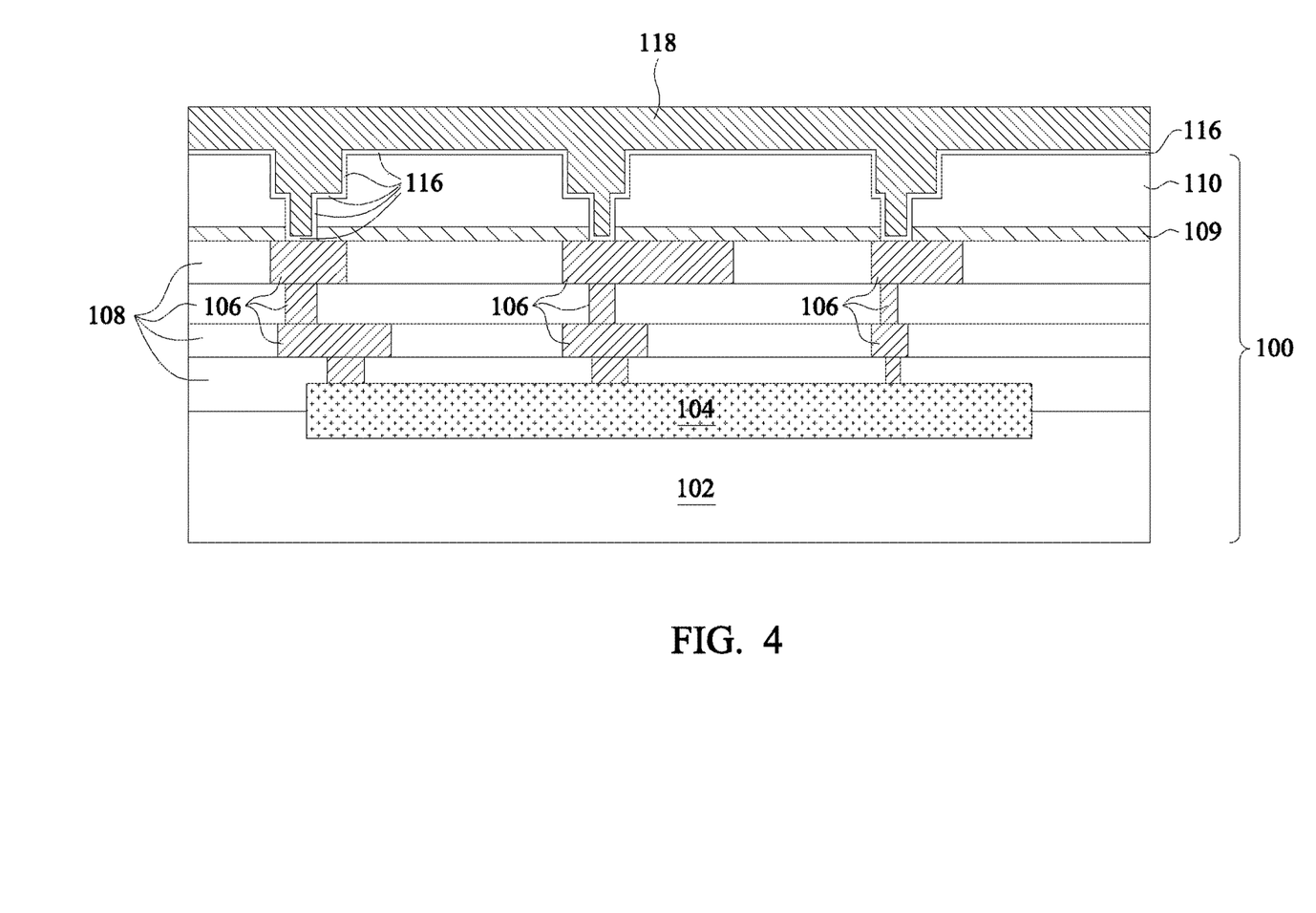

FIG. 4 illustrates the formation of conductive diffusion barrier (sometimes referred to as an adhesive layer) 116. In some embodiments, diffusion barrier layer 116 comprises titanium, titanium nitride, tantalum, tantalum nitride, or the like. Diffusion barrier layer 116 may be formed, for example, using Atomic Layer Deposition (ALD), Physical Vapor Deposition (PVD), or the like. Diffusion barrier layer 116 comprises first portions over surface dielectric layer 110, and second portions on the bottoms and sidewalls of trenches 112 and via openings 114.

Next, metallic material 118 is formed, for example, through Electro-Chemical Plating (ECP). Metallic material 118 fills the remaining portions of trenches 112 and via openings 114. Metallic material 118 further includes some portions over the top surface of surface dielectric layer 110. Metallic material 118 may comprise copper, aluminum, nickel, tungsten, or alloys thereof. In some exemplary embodiments, metallic material 118 comprises copper. Throughout the description, diffusion barrier layer 116 and metallic material 118 are also referred to as conductive materials.

Figure 5:
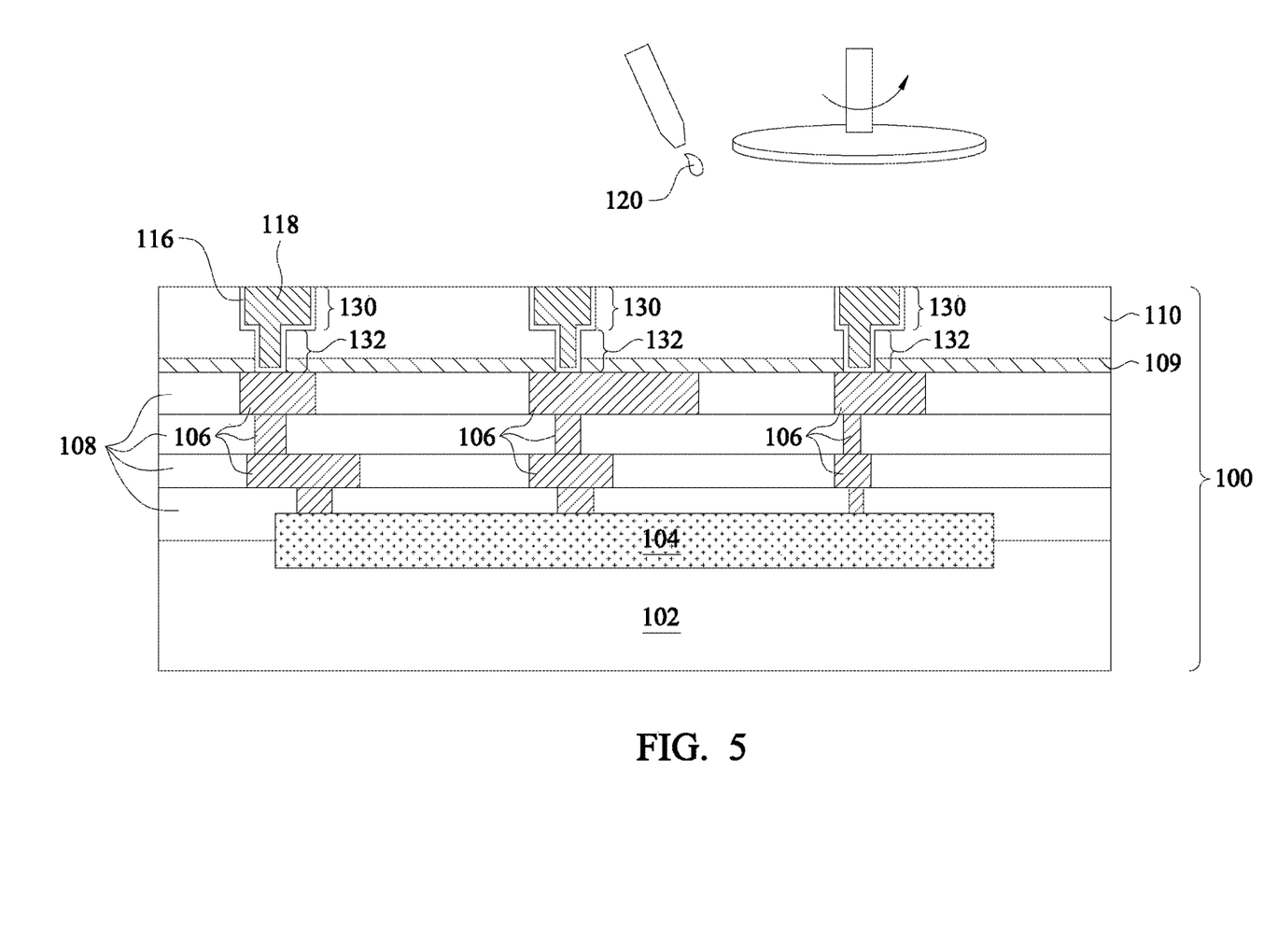

Next, as shown in FIGS. 5 and 6, a planarization such as a Chemical Mechanical Polish (CMP) is performed to remove excess portions of metallic material 118 and diffusion barrier layer 116. Referring to FIG. 5, a first CMP step is performed. In the first CMP step, slurry 120 is selected to remove the excess portion of metal 118. In some embodiments, in the first CMP step, slurry 120 comprises Oxalic acid, $H_2O_2$, and/or an abrasive such as $SiO_2$ particles, etc. The first CMP step is performed until the barrier metal 118 is exposed. As a result of the first CMP step, metal pads 130 and vias 132 are formed, which include the remaining portions of diffusion barrier layer 116 and metallic material 118.

Next, as shown in FIG. 6, a second CMP step is performed in order to polish the barrier layer, make the top surfaces of metal pads 130 and surface dielectric layer 110 coplanar with each other. In the second CMP step, slurry 122 is dispensed. Slurry 122 is selected according to the materials of metallic material 118 and barrier layer 116, so that the galvanic potential difference between metal 118 and barrier layer 116 is increased. For example, the galvanic potential difference is equal to or greater than about 0.3V in the second CMP. Enlarging the galvanic potential difference between PR118 and PR110 is advantageous for forming corner trenches between metallic material 118 and barrier layer 116.

Corner trenches formation between metallic material 118 and barrier layer 116 is related to the galvanic potential of metallic material 118 and barrier layer 116 and the slurry PH value. Different slurries 122 may be selected to suit to the materials of metallic material 118 and barrier layer 116. For example, when metallic material 118 comprises copper, and barrier layer 116 comprises TiN or Ta, slurry 122 may be chosen to include $K_2SO_4$, citric acid, benzotriazole, etc., so that corner trenches are formed.

In accordance with some embodiments, as a result of the second CMP step, trenches 134 are formed. Furthermore, means are taken to make trenches 134 deeper. For example, in the embodiments of the present disclosure, no thermal treatments to metallic material 118 is performed before the CMP since a thermal treatment performed on metallic material 118 before the CMP may result in the increase in the grain size of the grains of metallic material 118. The increased grain size causes the adverse reduction/elimination of voids/trench in metallic material 118. In accordance with some embodiments of the present disclosure, between the plating of metallic material 118 (FIG. 4) and the second CMP step, no thermal treatment that may result in the increase in the grain size of metallic material 118 is performed. For example, no thermal process having the temperatures higher than about 250° C. is performed. Thermal treatments whose temperatures are lower than the required temperature for increasing the grain size of metallic material 118, however, may be (or may not be) performed in accordance with the embodiments of the present disclosure.

Furthermore, the second CMP step has the effect of increasing depth D1 of trenches 134. In some embodiments, depth D1 of trenches 134 is greater than about 0.03 µm, and may be in the range between about 0.03 µm and about 0.1 µm. Experiment results obtained from sample wafers indicate that when depth D1 is greater than about 0.03 µm, the stress caused by the thermal expansion of metal pads 130 may be effectively released. The depth D1 of trenches 34 is affected by various factors including, and not limited to, the formation process of metallic material 118, the composition of metallic material 118, the composition of slurry 122, and the like. In accordance with the embodiments of the present disclosure, the process of the second CMP step is prolonged to achieve the desirable depth D1. The optimal duration of the second CMP step is determined through experiments, so that desirable depth D1 is achieved without excessively increasing the duration of the second CMP step. In some exemplary embodiments, the length of the second CMP step is longer than about 150 seconds, and may be in the range between about 150 seconds and about 250 seconds.

In some embodiments, width W1 of trenches 134 is greater than about 0.03 µm, and may be in the range between about 0.03 µm and about 0.1 µm. As illustrated in FIG. 6, trenches 134 occur at the outer boundary of metallic material 118, which interfaces with the sidewall portions of diffusion barrier layer 116. The top portions of the sidewalls of diffusion barrier layer 116 are exposed to trenches 134. After the CMP, the top edges of the sidewall portions of diffusion barrier layer 116 are substantially level with the top surface of surface dielectric layer 110.

Figure 7:
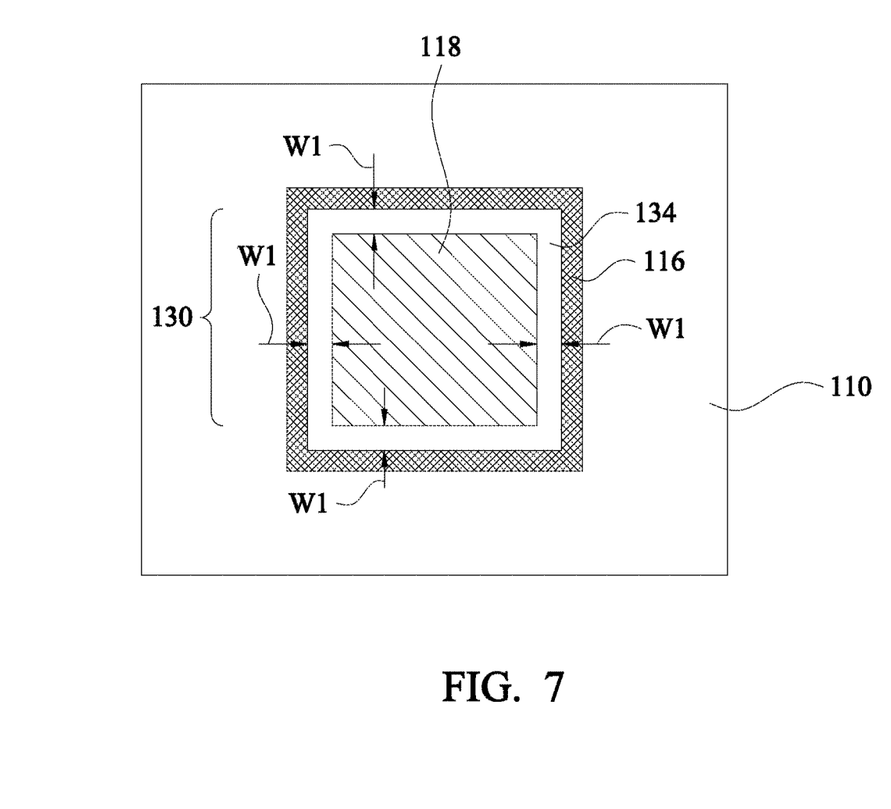
FIG. 7 is a top view of a metal pad in the first package component in accordance with some exemplary embodiments.

FIG. 7 illustrates a top view of one of metal pads 130. As shown in FIG. 7, the sidewall portions of diffusion barrier layer 116 forms a sidewall ring, with trench 134 forming a trench ring encircled by the sidewall ring. Trenches 134 are thus self-aligned to the outer edges of metallic material 118. Furthermore, trench ring 134 has four sides that have the uniform width W1.

Figure 8:
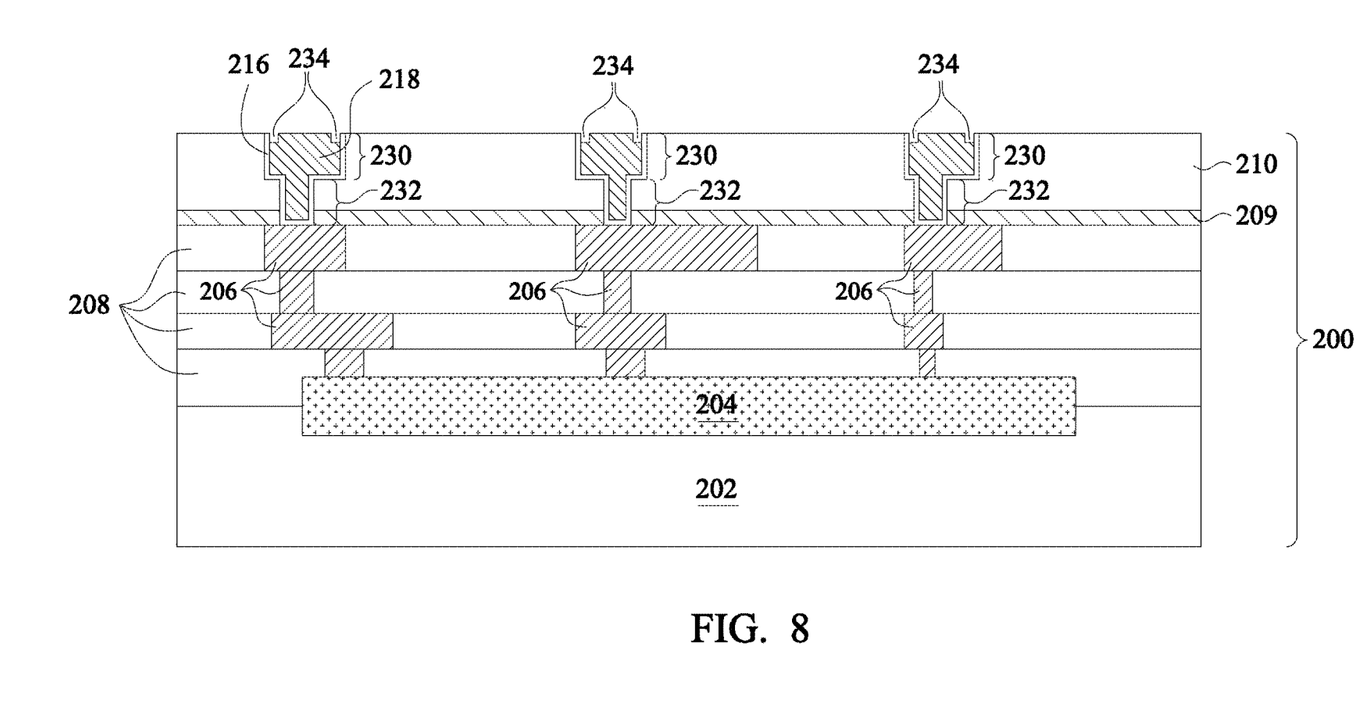
FIG. 8 is a cross-sectional view of a second package component in accordance with some exemplary embodiments.

FIG. 8 illustrates package component 200, which is to be bonded to package component 100. Package component 200 may also be selected from a device wafer, an interposer wafer, a package substrate, and the like. Package component 200 may have a structure similar to what is described for package component 100, and the details of the material and formation processes are not repeated herein. The features in package component 200 may be found referring to the like features in package component 100, with the like features in package component 100 starting with number "1," which features correspond to the features in package component 200 and having reference numerals starting with number "2." For example, in the illustrated FIG. 8, package component 200 includes substrate 202, active devices 204, dielectric layers 208, metal lines and vias 206 in dielectric layers 208, surface dielectric layer 210, metal pads 230, and vias 232. Metal pads 230 and vias 232 comprise diffusion barrier layer 216 and filling metal 218. Trenches 234 are formed at the edges of filling metal 218.

Figure 9:
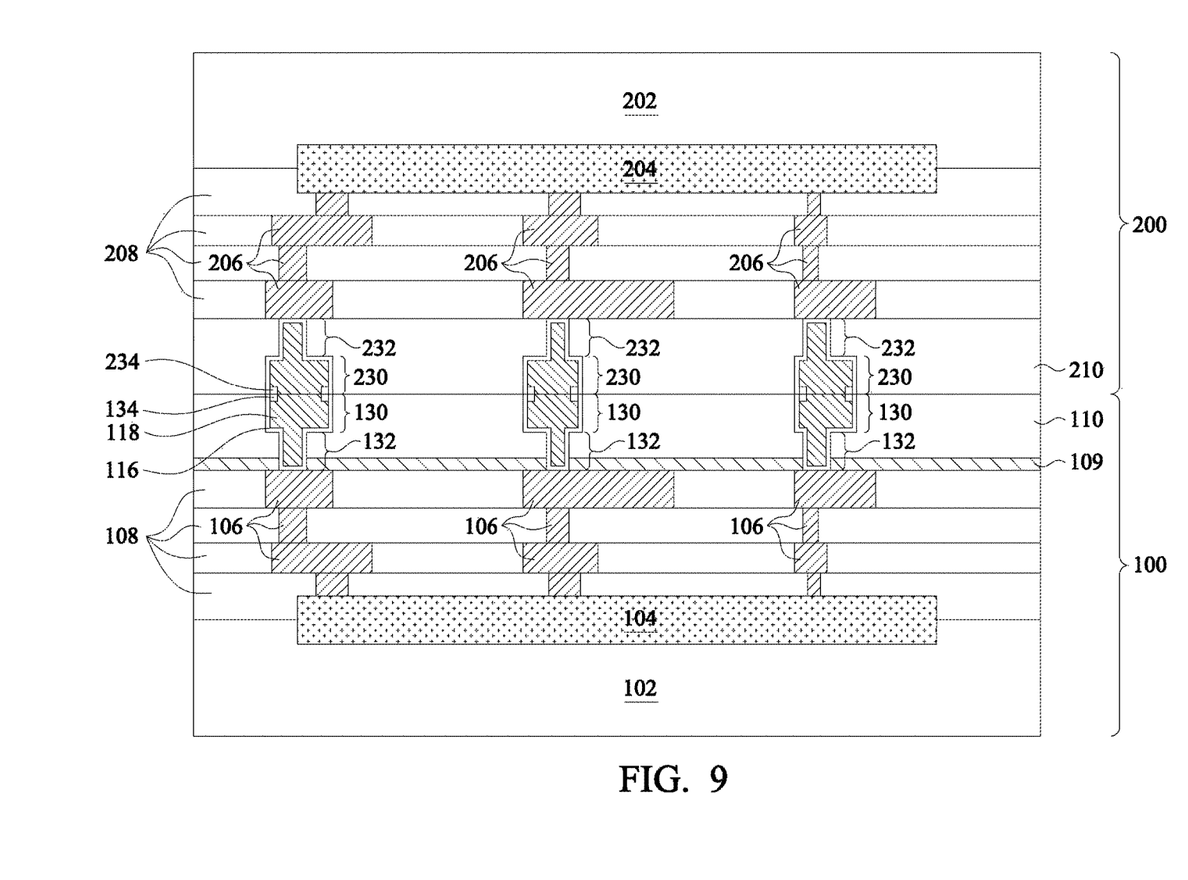
FIG. 9 is a cross-sectional view in the bonding of a first package component with a second package component in accordance with some exemplary embodiments.

Next, as shown in FIG. 9, package components 100 and 200 are pre-bonded. In the pre-bonding, package components 100 and 200 are first aligned, with metal pads 130 of package component 100 aligned to metal pads 230 of package component 200. Furthermore, trench 134 may also be aligned to trench 234 when metal pads 130 and 230 have the same top-view size. After the alignment, package components 100 and 200 are pressed against each other. During the pre-bonding, a small pressing force may be applied to press package components 100 and 200 against each other, which pressing force may be lower than about 5 Newton per die, for example. The pre-bonding may be performed at the room temperature (for example, between about 21° C. to about 25° C.), although higher temperatures may be used. The bonding time may be shorter than about 1 minute, for example.

After the pre-bonding, surface dielectric layer 110 and 210 are bonded to each other. The bonding strength, however, needs to be improved in a subsequent annealing step. The bonded package components 100 and 200 may be annealed at a temperature between about 300° C. and about 400° C., for example. The annealing may be performed for a period of time between about 1 hour and 2 hours. When temperature rises, the OH bond in surface dielectric layers 110 and 210 break to form strong Si—O—Si bonds, and hence package components 100 and 200 are bonded to each other through fusion bonds (and through Van Der Waals force). In addition, during the annealing, the copper in metal pads 130 and 230 diffuse to each other, so that metal-to-metal bonds are also formed. Hence, the resulting bonds between package components 100 and 200 are hybrid bonds. After the bonding, the bonded package components 100 and 200 are sawed into packages, with the portions of package components 100 and 200 in the packages comprising dies.

Figure 10:
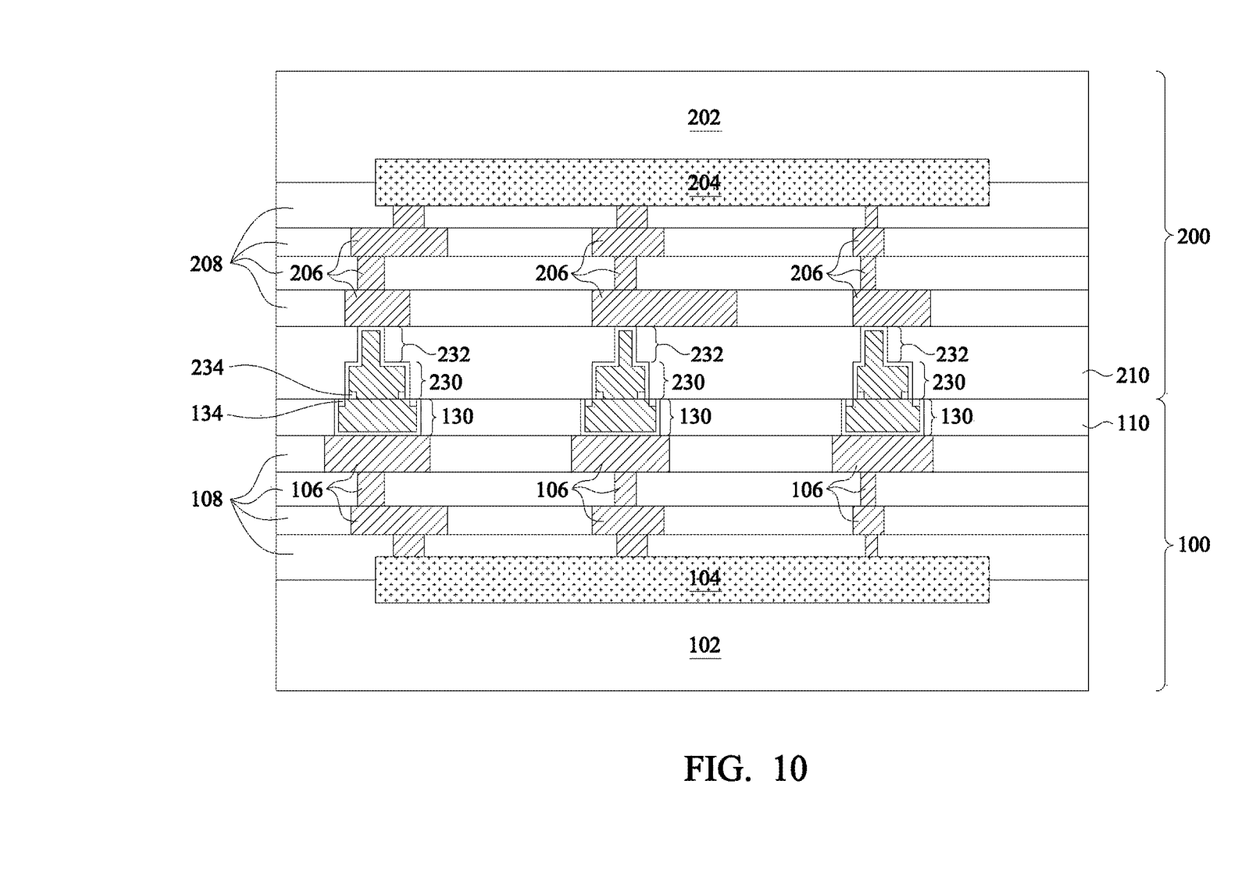
FIG. 10 is a cross-sectional view in the bonding of a first package component with a second package component in accordance with some alternative exemplary embodiments.

As shown in FIG. 10, trenches 134 and 234 are sealed to form air gaps. It is appreciated that although the term "air gap" is used, trenches 134 and 234 are not necessarily filled with air. Depending on the environment in which the pre-bonding and annealing is performed, trenches 134 and 234 may be vacuumed, or may be filled with other types of gases such as nitrogen. In accordance with some embodiments, metal pads 130 and 230 have the same top-view sizes, and trenches 134 and 234 may be aligned to each other, and are interconnected to form continuous air gaps 134 and 234 extending from package component 100 into package component 200. Furthermore, the integrated air gaps 134 and 234 encircle the bonded metal pads 130 and 230.

FIG. 10 illustrates a package comprising two metal pads bonded together, wherein the two metal pads have different top-view sizes. Accordingly, air gaps 134 and 234 of the same bonded metal-pad-pair are not interconnected to form continuous air gaps. Rather, air gap 134 is sealed by, and is exposed to, surface dielectric layer 210, and air gap 234 is sealed by, and is exposed to, metal pad 130.

In addition, the metal pads involved in the hybrid bonding may have single damascene structures rather than dual damascene structures. For example, as shown in FIG. 10, metal pads 130 have single damascene structures, and metal pads 230 have dual damascene structures, both are in the contemplated scope of the present disclosure.

In the embodiments of the present disclosure, due to the formation of air gaps, free spaces are generated around the bonded metal pads. When temperature rises, the metal pads expand more than the surface dielectric layers since their Coefficient of Thermal Expansion (CTE) is greater than the CTE of the surface dielectric layers. Without the air gap, the expanded metal pads apply stresses to the surrounding dielectric layers, and hence cause damage to the fusion bonds of the surrounding dielectric layers. The dielectric layers thus may delaminate. With the air gaps, free spaces are created to allow the metal pads to expand freely without applying stresses on the surrounding dielectric layers, and hence the surrounding dielectric layers may have good fusion bonds formed. The air gaps are formed in regions wherein the stresses are highest, and hence effectively reduce the delamination of bonded dielectric layers. Furthermore, the formation of air gaps is self-aligned, and hence there is no process variation concern. In addition, there is no additional process steps involved.

In accordance with some embodiments of the present disclosure, a package component includes a surface dielectric layer having a first planar surface, and a metal pad in the surface dielectric layer. The metal pad includes a diffusion barrier layer that includes sidewall portions, and a metallic material encircled by the sidewall portions of the diffusion barrier layer. The metallic material has a second planar surface level with the first planar surface. An air gap extends from the second planar surface of the metallic material into the metallic material. An edge of the air gap is aligned to an edge of the metallic material.

In accordance with alternative embodiments of the present disclosure, a package includes a first package component and a second package component. The first package component includes a first surface dielectric layer, and a first metal pad in the first surface dielectric layer. The first metal pad includes a first surface and a second surface opposite to the first surface. A first air gap extends from the first surface of the first metal pad into the first metal pad, wherein the first air gap stops at an intermediate level between the first surface and the second surface. The second package component includes a second surface dielectric layer bonded to the first surface of the first surface dielectric layer, and a second metal pad in the second surface dielectric layer. The second metal pad is bonded to the first metal pad.

In accordance with yet alternative embodiments of the present disclosure, a method includes forming a first package component, which includes forming a first surface dielectric layer at a surface of an initial structure of the first package component, etching the first surface dielectric layer to form an opening, filling the first opening with conductive materials, and performing a CMP to remove excess portions of the conductive materials. Remaining portions of the conductive materials form a first metal pad, with a first trench ring generated in the first metal pad and adjacent to peripherals of the metal pad. The first package component is bonded to a second package component, wherein the first metal pad is bonded to a second metal pad of the second package component, and the first surface dielectric layer is bonded to a second surface dielectric layer of the second package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first Chemical Mechanical Polish (CMP) on surface features of a first package component, wherein the surface features comprise a first metal pad encircled by a first surface dielectric layer, and the first CMP is performed using a first slurry;
performing a second CMP on the surface features of the first package component using a second slurry different from the first slurry, wherein the second CMP is started when the first surface dielectric layer is exposed, wherein in the second CMP, a first trench is formed in a peripheral region of the first metal pad; and
bonding the first package component to a second package component, wherein the first metal pad is bonded to a second metal pad of the second package component, and the first surface dielectric layer is bonded to a second surface dielectric layer of the second package component.

2. The method of claim 1, wherein the first metal pad comprises a barrier layer, and a metallic material encircled by the barrier layer, wherein a sidewall of the barrier layer is exposed to the first trench.

3. The method of claim 2, wherein the second metal pad comprises a second trench, and the first trench is joined to the second trench.

4. The method of claim 2, wherein after the first CMP and before the second CMP, substantially no trench is generated in the metallic material.

5. The method of claim 2, wherein in the second CMP, a galvanic potential difference between the metallic material and the barrier layer is greater than about 0.3V.

6. The method of claim 2, wherein the metallic material comprises copper, the first surface dielectric layer comprises silicon oxynitride, and the second CMP is performed using a slurry comprising $K_2SO_4$, citric acid, or benzotriazole.

7. The method of claim 1, wherein the first trench has a depth greater than about 0.3 μm.

8. The method of claim 2, wherein at a stopping time point of the first CMP, the first surface dielectric layer is covered by horizontal portions of the barrier layer, and the barrier layer is conductive.

9. A method comprising:
forming an opening in a dielectric layer;
depositing a barrier layer, wherein the barrier layer extends into the opening;
filling the opening with a metallic material, with the metallic material being over the barrier layer;
performing a first Chemical Mechanical Polish (CMP) to remove excess portions of the metallic material and the barrier layer until the dielectric layer is revealed, wherein the first CMP is performed using a first slurry, and wherein remaining portions of the metallic material and the barrier layer in the opening form a first metal pad; and
performing a second CMP on the first metal pad using a second slurry different from the first slurry to form trench in a peripheral region of the first metal pad, wherein at a starting time point of the second CMP, the dielectric layer is exposed.

10. The method of claim 9, wherein after the first CMP and before the second CMP, substantially no trench is generated to extend into the first metal pad.

11. The method of claim 9, wherein the first metal pad is recessed more in the peripheral region than in a center region encircled by the peripheral region.

12. The method of claim 9, wherein the trench is in the metallic material, and a sidewall of the barrier layer is exposed to the trench.

13. The method of claim 9, wherein the trench forms a trench ring.

14. The method of claim 9, wherein in the second CMP, a galvanic potential difference between the metallic material and the barrier layer is greater than about 0.3V.

15. The method of claim 9, wherein the metallic material comprises copper, the dielectric layer comprises silicon oxynitride, and the second CMP is performed using a slurry comprising $K_2SO_4$, citric acid, or benzotriazole.

16. The method of claim 9 further comprising bonding the first metal pad with a second metal pad.

17. A method comprising:
performing a first Chemical Mechanical Polish (CMP) on a first metal pad of a first package component, wherein the first metal pad is encircled by a first surface dielectric layer, and substantially no recess is generated to extend from a top surface of the first metal pad into the first metal pad;

performing a second CMP on the first metal pad of the first package component, wherein the second CMP is performed using a second CMP condition different from a first CMP condition for performing the first CMP, with a trench generated to extend into the first metal pad; and bonding the first package component to a second package component, wherein the first metal pad is bonded to a second metal pad of the second package component, and wherein the first surface dielectric layer is bonded to a second surface dielectric layer of the second package component.

18. The method of claim 17, wherein the first CMP condition comprises a first slurry, and the second CMP condition comprises a second slurry different from the first slurry.

19. The method of claim 17, wherein the trench forms a ring, with the trench separated from the first surface dielectric layer by a thin layer of conductive material.

20. The method of claim 19, wherein the thin layer of conductive material is formed of a material different from a material of a portion of the first metal pad encircled by the trench.

* * * * *